United States Patent
Wu et al.

(10) Patent No.: US 10,555,424 B1
(45) Date of Patent: Feb. 4, 2020

(54) CIRCUIT BOARD, SEMICONDUCTOR DEVICE INCLUDING THE SAME, AND MANUFACTURING METHOD THEREOF

(71) Applicant: Taiwan Semiconductor Manufacturing Co., Ltd., Hsinchu (TW)

(72) Inventors: Jiun-Yi Wu, Taoyuan (TW); Chien-Hsun Lee, Hsinchu County (TW); Chen-Hua Yu, Hsinchu (TW); Chung-Shi Liu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/285,241

(22) Filed: Feb. 26, 2019

(51) Int. Cl.
*H05K 3/40* (2006.01)
*H01L 23/373* (2006.01)
*H01L 23/538* (2006.01)
*H05K 3/00* (2006.01)

(52) U.S. Cl.
CPC ....... *H05K 3/4046* (2013.01); *H01L 23/3735* (2013.01); *H01L 23/5384* (2013.01); *H05K 3/0061* (2013.01)

(58) Field of Classification Search
USPC .......................................... 361/748
See application file for complete search history.

(56) References Cited

U.S. PATENT DOCUMENTS

| | | | |
|---|---|---|---|
| 2006/0022787 A1* | 2/2006 | Brennan | H01F 17/0006 336/200 |
| 2006/0138591 A1* | 6/2006 | Amey, Jr. | H01L 23/49822 257/532 |

\* cited by examiner

*Primary Examiner* — Andargie M Aychillhum
(74) *Attorney, Agent, or Firm* — JCIPRNET

(57) ABSTRACT

A structure, a semiconductor device and a manufacturing method thereof are provided. The structure includes a core dielectric layer, a patterned conductive plate, a metallization layer, an upper build-up stack and a lower dielectric layer. The patterned conductive plate has ducts there-through and is entrenched in the core dielectric layer. The metallization layer is disposed within the ducts and further extends over an upper surface and a bottom surface of the core dielectric layer. The upper build-up stack is disposed on the upper surface of the core dielectric layer. The upper build-up stack includes conductive layers electrically connected to the metallization layer. The lower dielectric layer is disposed on the bottom surface of the core dielectric layer and is in direct physical contact with a bottom surface of the patterned conductive plate. A material of the lower dielectric layer is different from a material of the core dielectric layer.

10 Claims, 10 Drawing Sheets

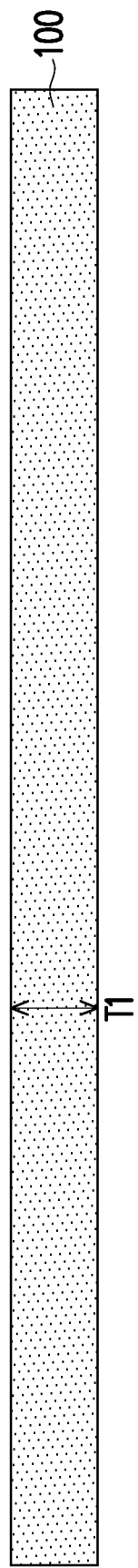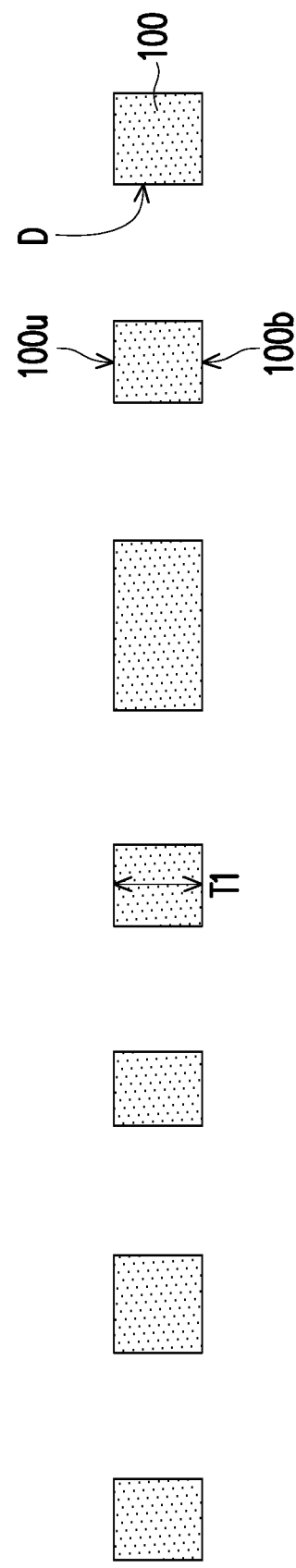

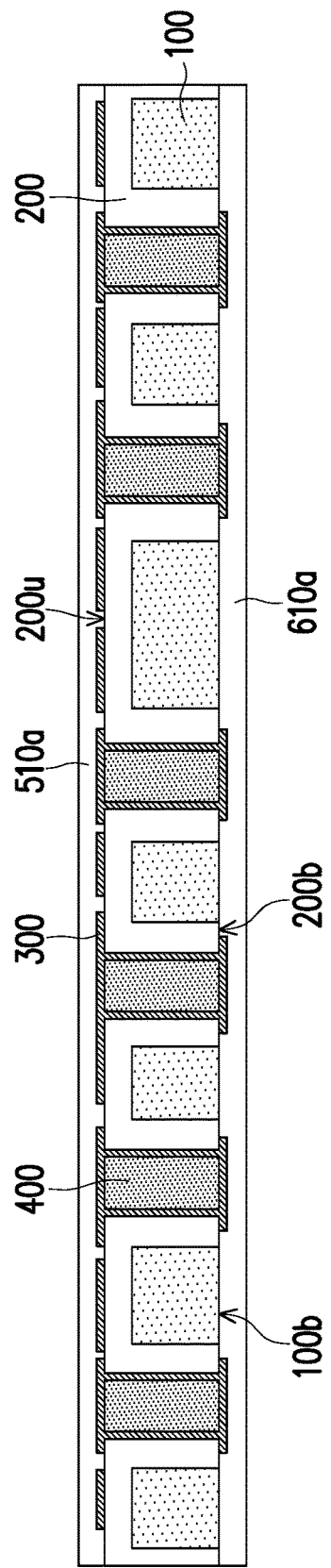
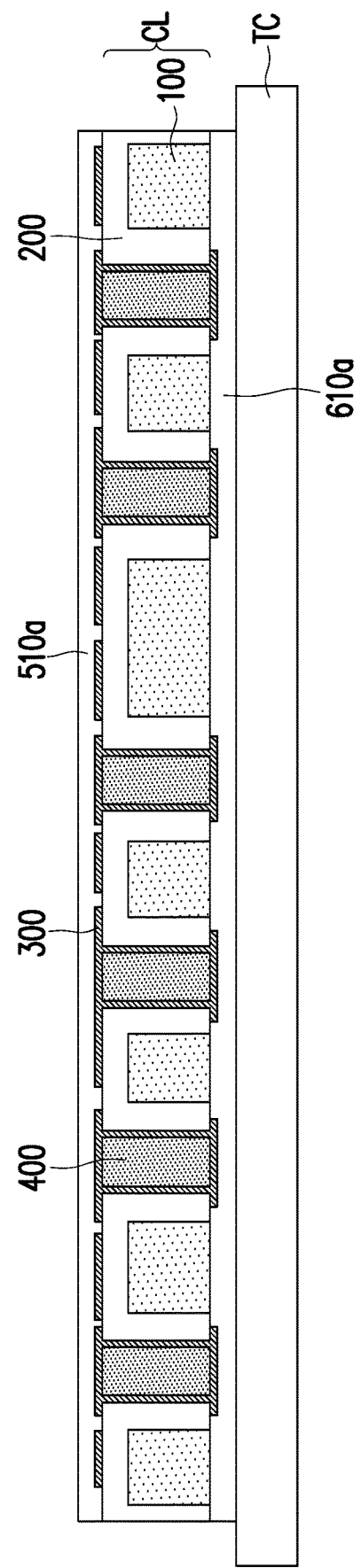

CIRCUIT BOARD, SEMICONDUCTOR DEVICE INCLUDING THE SAME, AND MANUFACTURING METHOD THEREOF

BACKGROUND

Contemporary high performance computing systems consisting of one or more electronic devices have become widely used in a variety of advanced electronic applications. When integrated circuit components or semiconductor chips are packaged for these applications, one or more chip packages are generally bonded to a circuit carrier (e.g., a system board, a printed circuit board, or the like) for electrical connections to other external devices or electronic components. To respond to the increasing demand for miniaturization, higher speed and better electrical performance (e.g., lower transmission loss and insertion loss), more creative packaging and assembling techniques are actively researched.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1A through FIG. 1L are schematic cross-sectional views of structures produced at various stages of a manufacturing method of a semiconductor device according to some embodiments of the present disclosure.

DETAILED DESCRIPTION

Figure 1C:
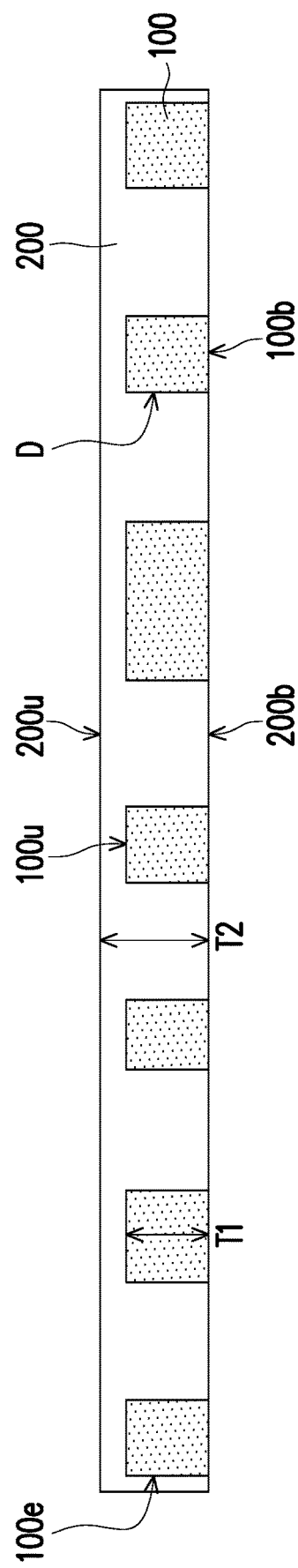

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1A through FIG. 1L are schematic cross-sectional views of structures produced at various stages of a manufacturing method of a semiconductor device 10 (shown in FIG. 1L) according to some embodiments of the present disclosure. Referring to FIG. 1A, a conductive plate 100 (or metal plate) is provided. In some embodiments, a material of the conductive plate 100 is selected from the group consisting of nickel-iron alloy 42 (alloy containing 42% nickel and 58% iron; 42Ni-58Fe), nickel-iron alloy 52 (alloy containing 50.5% nickel and 48.5% iron; 50.5Ni-48.5Fe) and Kovar (nickel-cobalt ferrous alloy containing 29% nickel, 17% cobalt and 54% iron; 29Ni-17Co-54Fe). In certain embodiments, a lower coefficient of thermal expansion (CTE) of the conductive plate 100 is achieved by using nickel-iron alloy 42 as a material of the conductive plate 100. In certain embodiments, a thickness T1 of the conductive plate 100 is in a range from 25 µm to 600 µm. However, the disclosure is not limited thereto, and the thickness of the conductive plate 100 may be adjusted based on product requirements.

Referring to FIG. 1A and FIG. 1B, the conductive plate 100 is patterned to form ducts D. In some embodiments, the ducts D pass through the patterned conductive plate 100 from one side to the opposite side. That is, the ducts D may extend from an upper surface 100u of the patterned conductive plate 100 to an opposite bottom surface 100b. The ducts D may have a first end opening on the upper surface 100u of the patterned conductive plate 100 and a second end opening on the bottom surface 100b of the patterned conductive plate 100, crossing the patterned conductive plate 100 for its entire thickness T1. In some embodiments, the opposite first and second ends of the ducts D are vertically aligned (i.e., are aligned along a thickness direction of the conductive plate 100). In certain embodiments, a mechanical drilling or punching process is performed to open the ducts D. In certain embodiments, a chemical etching (e.g., using $FeCl_3$) process is performed to form the ducts D. In some embodiments, the ducts D are formed in an array arrangement on the patterned conductive plate 100. That is, adjacent ducts D may open on the patterned conductive plate 100 keeping a regular distance along one or more directions. In some alternative embodiments, the distance of adjacent ducts D may vary based on actual design requirements. In some embodiments, regions of the same patterned conductive plate 100 may present different arrangements of the ducts D or distances between adjacent ducts D. For example, in a first region (not shown) of a patterned conductive plate 100 the ducts D may be aligned along a first direction and misaligned along a second direction perpendicular to the first direction, whilst in a second region (not shown) of the same patterned conductive plate 100 the ducts D may be aligned along both of the first direction and the second direction. The distributions or the shape of the ducts D may be optimized to release mechanical stresses incurred during subsequent manufacturing steps. Furthermore, the present disclosure poses no limitation to the number of ducts D formed on the patterned conductive plate 100, and said number may be adjusted based on product requirements.

Referring to FIG. 1C, a core dielectric layer 200 is provided which wraps the patterned conductive plate 100. In some embodiments, the core dielectric layer 200 extends over the upper surface 100u of the patterned conductive plate 100 and fills the ducts D. In some embodiments, the core dielectric layer 200 further covers an outer edge 100e of the patterned conductive plate 100. In some embodiments, the outer edge 100e connects the upper surface 100u and the bottom surface 100b of the patterned conductive plate 100. In some embodiments, the core dielectric layer 200 exposes the bottom surface 100b of the patterned conductive plate 100. A thickness T2 of the core dielectric layer 200 may be larger than a thickness T1 of the patterned conductive plate 100. In some embodiments, a ratio between the thickness T1 of the patterned conductive plate 100 over the thickness T2 of the core dielectric layer 200 is in the range from 5% to 95%. A material of the core dielectric layer 200 is not particularly limited, and may include molding compound, Ajinomoto build-up film, polymeric materials (e.g., polyimide, polyester, benzocyclobutene (BCB), polybenzoxazole, or the like), prepreg, resin coated copper (RCC), photo image dielectric (PID), phenolic paper, phenolic cotton paper, woven fiberglass cloth, impregnated woven fiberglass cloth, or a combination thereof. In some embodiments, the core dielectric layer 200 is laminated over the patterned conductive plate 100. In some alternative embodiments, the core dielectric layer 200 is formed by molding (e.g., compression molding) or other suitable techniques. In some embodiments, the patterned conductive plate 100 is subjected to a micro-roughening treatment before providing the core dielectric layer 200, to enhance adhesion and decrease the occurrence of delamination.

Figure 1D:
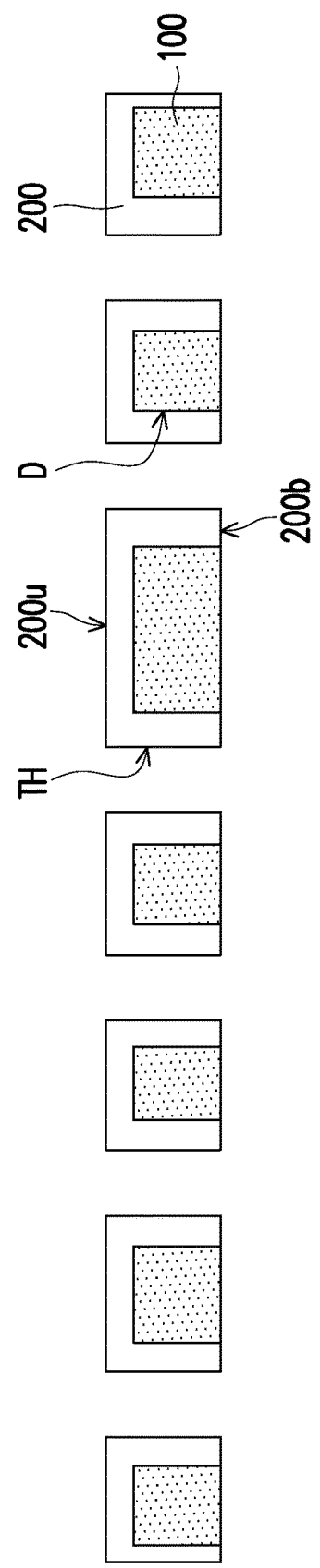

In some embodiments, referring to FIG. 1D, through holes TH are formed in the core dielectric layer 200. In some embodiments, the through holes TH extend from the upper surface 200u to the bottom surface 200b of the core dielectric layer 200. In some embodiments, the through holes TH are located within the ducts D. The through holes TH may run parallel to the ducts D along a vertical direction (thickness direction). The core dielectric layer 200 may partially fill the ducts D to define the through holes TH. That is, upon formation of the through holes TH in the core dielectric layer 200, no additional portions of the patterned conductive plate 100 are exposed. In some embodiments, the through holes TH may be formed by removing portions of the core dielectric layer 200 by mechanical or laser drilling, etching, or other suitable removal techniques, for example. A desmear treatment may be performed using plasma to remove residues remaining in the through holes TH. In some embodiments, the surface of the core dielectric layer 200 exposed within the through holes TH is subjected to a micro-roughening treatment to promote deposition of conductive material during subsequent process steps.

Figure 1E:
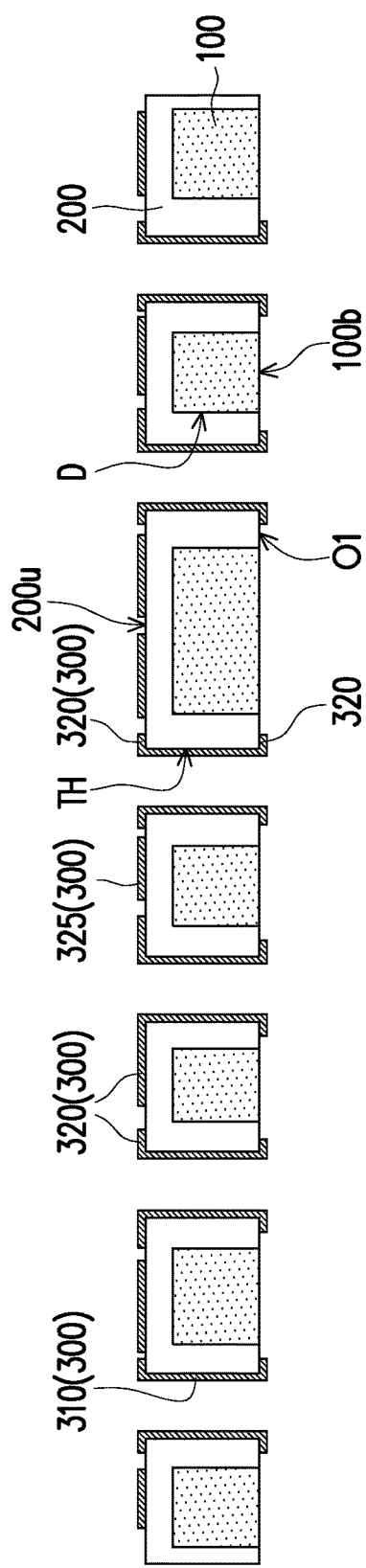

In some embodiments, referring to FIG. 1E, a metallization layer 300 may be provided over portions of the core dielectric layer 200. The metallization layer 300 may include via portions 310 disposed in the through holes TH in a thickness direction of the core dielectric layer 200, and pad portions 320 disposed in a contiguous manner with (attached to) the via portions 310 over the upper and bottom surfaces 200u and 200b of the core dielectric layer 200. The core dielectric layer 200 may separate the metallization layer 300 from the patterned conductive plate 100. In some embodiments, the metallization layer 300 may further include trace portions 325 as connecting tracks. In some embodiments, the trace portions 325 define a metallization pattern on the core dielectric layer 200. In some embodiments, the metallization layer 300 may partially wrap the core dielectric layer 200 and extend towards the bottom surface 100b of the patterned conductive plate 100 without physically contacting the patterned conductive plate 100. That is, the metallization layer 300 may include openings O1 exposing the bottom surface 100b of the patterned conductive plate 100 and portions of the core dielectric layer 200. In some embodiments, the via portions 310, the pad portions 320, and the trace portions 325 of the metallization layer 300 are formed by plating the through holes TH with a conductive material to a predetermined thickness (e.g., plating copper through electroless plating/electrochemical plating). In some embodiments, the via portions 310, the pad portions 320 and the trace portions 325 of the metallization layer 300 are formed by the same plating process. In some embodiments, the conductive material includes copper, aluminum, platinum, nickel, titanium, tantalum, chromium, gold, silver, tungsten, a combination thereof, or the like. Throughout the description, the term "copper" is intended to include substantially pure elemental copper, copper containing unavoidable impurities, and copper alloys containing elements such as tantalum, indium, tin, zinc, manganese, chromium, titanium, germanium, strontium, platinum, magnesium, aluminum or zirconium, etc. During the formation of the metallization layer 300 an auxiliary mask (not shown) may be used to prevent shortening between the metallization layer 300 and the patterned conductive plate 100. In some embodiments, the auxiliary mask includes a photoresist layer.

Figure 1F:
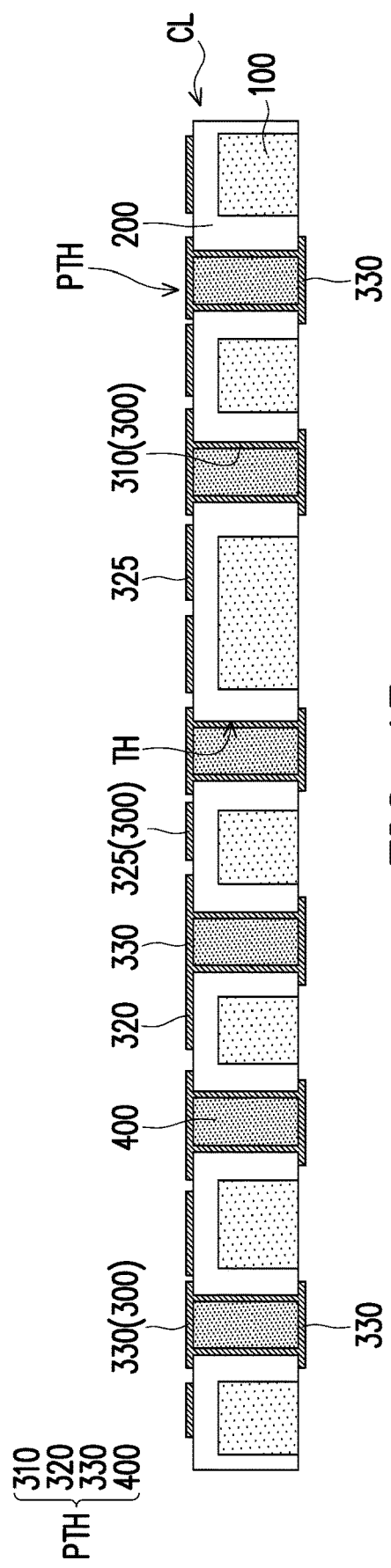

Referring to FIG. 1F, a via filler 400 may be disposed to fill the spaces surrounded by the via portions 310 of the metallization layer 300 formed in the through holes TH, and via caps 330 may be formed over the via filler 400. In some embodiments, via caps 330 disposed at both ends of a through hole TH and the via portions 310 lining the side surface of the same through hole TH may enclose the via filler 400 disposed in the same through hole TH. In some embodiments, the via filler 400 includes an insulating material, such as solder mask material, via plugging material, epoxy resins, or the like. In some alternative embodiments, the via filler 400 includes a conductive material. In certain embodiments, the via filler 400 may be formed by a roller coating process, or a screen printing process. In some embodiments, the material of the via filler 400 may be the same material used for the metallization layer 300. In some embodiments the via caps 330 are formed after the via filler 400, for example during a plating step. Formation of the via filler 400 and the via caps 330 completes the formation of a plated through via PTH. In some embodiments, the via caps 330 merge with the pad portions 320 which are formed during a different plating step. As such, in some embodiments the metallization layer 300 is formed via two (or more) plating steps. In one embodiment, a planarization process may be included to flatten the metallic features. Formation of the metallization layer 300 completes a core layer CL of a circuit board according to some embodiments of the present disclosure. In some embodiments, the core layer CL is considered to include the patterned conductive plate 100, the core dielectric layer 200, and the metallization layer 300. In some embodiments, the core layer CL further includes the via filler 400.

In some embodiments, referring to FIG. 1G, an upper dielectric material layer 510a and a lower dielectric material layer 610a are respectively formed over opposite surfaces of the core layer CL. In some embodiments, the upper dielectric material layer 510a extends over the entire upper surface 200u of the core dielectric layer 200, physically contacting the core dielectric layer 200 and the metallization layer 300. In some embodiments, at least the core dielectric layer 200 is interposed between the patterned conductive plate 100 and the upper dielectric material layer 510a. Portions of the metallization layer 300 may also be disposed between the patterned conductive plate 100 and the upper dielectric material layer 510a. In some embodiments, because the bottom surface 100b of the patterned conductive plate 100 is exposed by the core dielectric layer 200, the lower dielectric material layer 610a physically contacts the patterned conductive layer 100, the core dielectric layer 200 and the metallization layer 300. In some embodiments, the lower dielectric material layer 610a electrically insulate the patterned conductive plate 100 from the metallization layer 300. In some embodiments, the upper dielectric material layer 510a and the lower dielectric material layer 610a include the same material. In some alternative embodiments, the upper dielectric material layer 510a and the lower dielectric material layer 610a include different materials. In some embodiments, materials of the upper dielectric material layer 510a and the lower dielectric material layer 610a include polyimide, epoxy resin, acrylic resin, phenol resin, benzocyclobutene (BCB), polybenzooxazole (PBO), or any other suitable polymer-based dielectric material. The dielectric material layers 510a and 610a may be formed by suitable fabrication techniques such as spin-on coating, chemical vapor deposition (CVD), plasma-enhanced chemical vapor deposition (PECVD), or the like. In some embodiments, the material of the lower dielectric material layer 610a is different from the material of the core dielectric layer 200.

Referring to FIG. 1H, in some embodiments a temporary carrier TC is provided on a side of the lower dielectric material layer 610a further away from the core layer CL. That is, the lower dielectric material layer 610a may be sandwiched between the core layer CL and the temporary carrier TC. In some embodiments, the temporary carrier TC is a glass substrate, a metal plate, a plastic supporting board or the like, but other suitable substrate materials may be used as long as the materials are able to withstand the subsequent steps of the process. In some embodiments, a de-bonding layer (not shown) is provided on the temporary carrier TC to facilitate peeling the temporary carrier TC away from the manufacturing intermediate when required by the manufacturing process. In some embodiments, the de-bonding layer includes a light-to-heat conversion (LTHC) release layer.

Figure 1I:
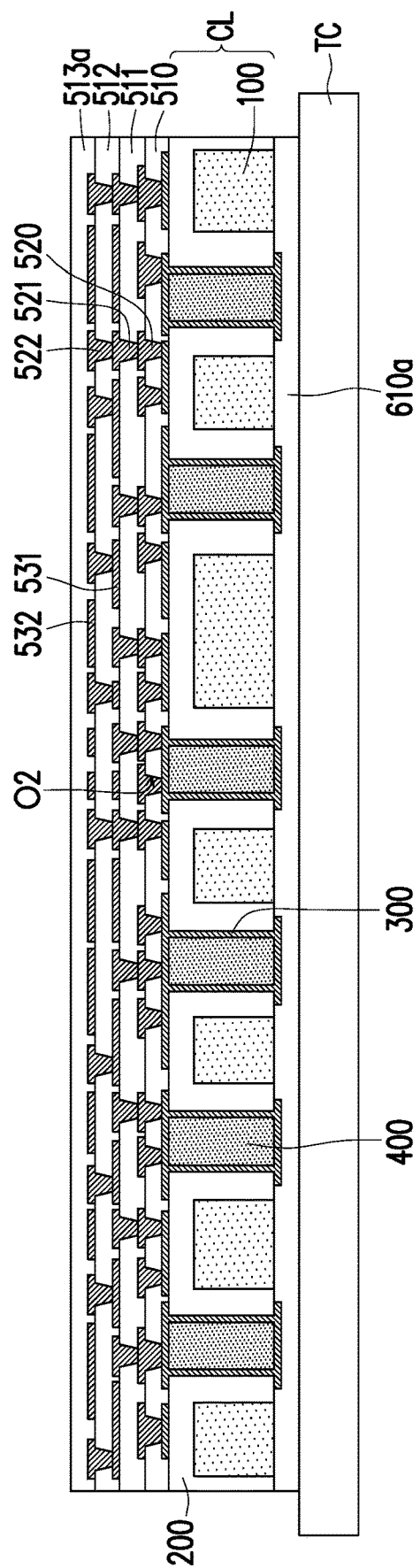

Referring to FIG. 1I, in some embodiments, the upper dielectric material layer 510a (shown in FIG. 1H) is patterned to form an upper dielectric layer 510 including openings O2 exposing portions of the metallization layer 300. Thereafter, conductive vias 520 may be formed in the openings O2 electrically contacting the metallization layer 300. In some embodiments, multiple dielectric layers 511, 512, 513a may be stacked over the upper dielectric layer 510 and the conductive vias 520, including embedded conductive layers 531, 532 electrically interconnected by conductive vias 521, 522. The conductive layers 531 and 532 may include multiple conductive patterns respectively formed over the dielectric layers 511 and 512. In some embodiments, the conductive vias 520, 521, 522 establish electrical connection between the conductive layers 531, 532 and the metallization layer 300. In some embodiments, the topmost dielectric layer 513a covers the conductive layer 532 disposed on the underlying dielectric layer 512 and the conductive vias 522 embedded in the dielectric layer 512. In some embodiments, materials of the conductive layers 531 and 532 and of the conductive vias 520, 521, 522 include aluminum, titanium, copper, nickel, tungsten, alloys or combination thereof. The conductive layers 531, 532 and the conductive vias 520, 521, 522 may be formed by, for example, electroplating, deposition, and/or photolithography and etching. In some embodiments, a material and a manufacturing process of the dielectric layers 511, 512, 513a is similar to what previously described for the upper dielectric layer 510, and a description thereof is omitted herein. It should be noted that the number of the conductive layers 531, 532, the number of conductive vias 520, 521, 522, and the number of the dielectric layers 510, 511, 512, 513a illustrated in FIG. 1I are merely for illustrative purposes, and the disclosure is not limited thereto. In some alternative embodiments, more or fewer conductive layers, dielectric layers and conductive vias are formed depending on the circuit design. In these embodiments, the conductive layers are sandwiched between adjacent dielectric layers and are interconnected with one another by the conductive vias.

Figure 1J:
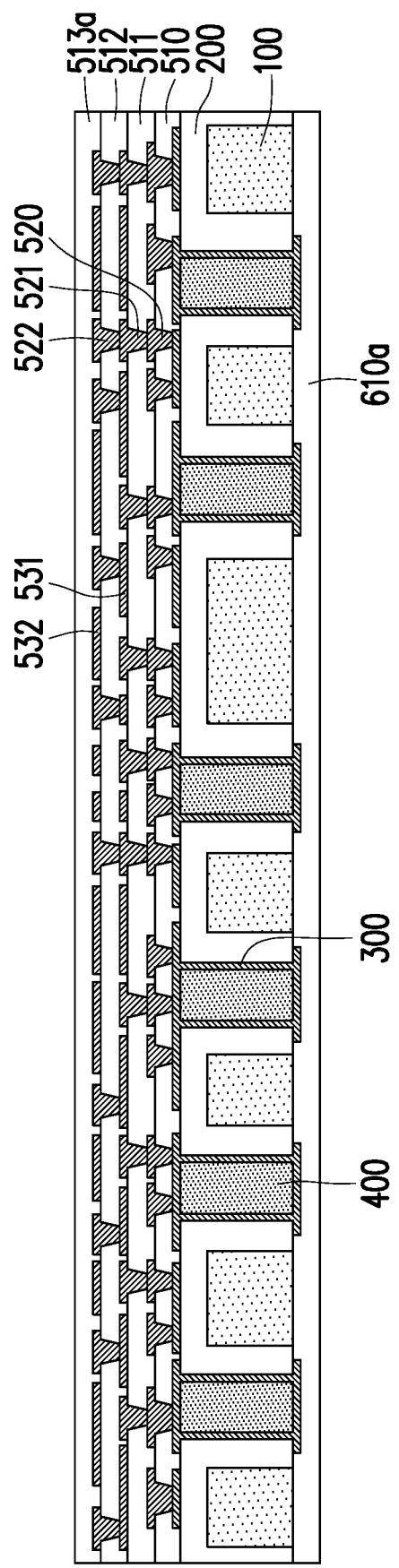

In some embodiments, referring to FIG. 1I and FIG. 1J, the temporary carrier TC is removed. In some embodiments, if the de-bonding layer (e.g., a LTHC release layer) is included, the de-bonding layer is irradiated with a UV laser so that the carrier TC and the de-bonding layer are easily peeled off from the lower dielectric material layer 610a. Nevertheless, the de-bonding process is not limited thereto, and other suitable de-bonding methods may be used in some alternative embodiments. With the removal of the temporary carrier TC, the lower dielectric material layer 610a becomes exposed and available for further processing.

Figure 1K:
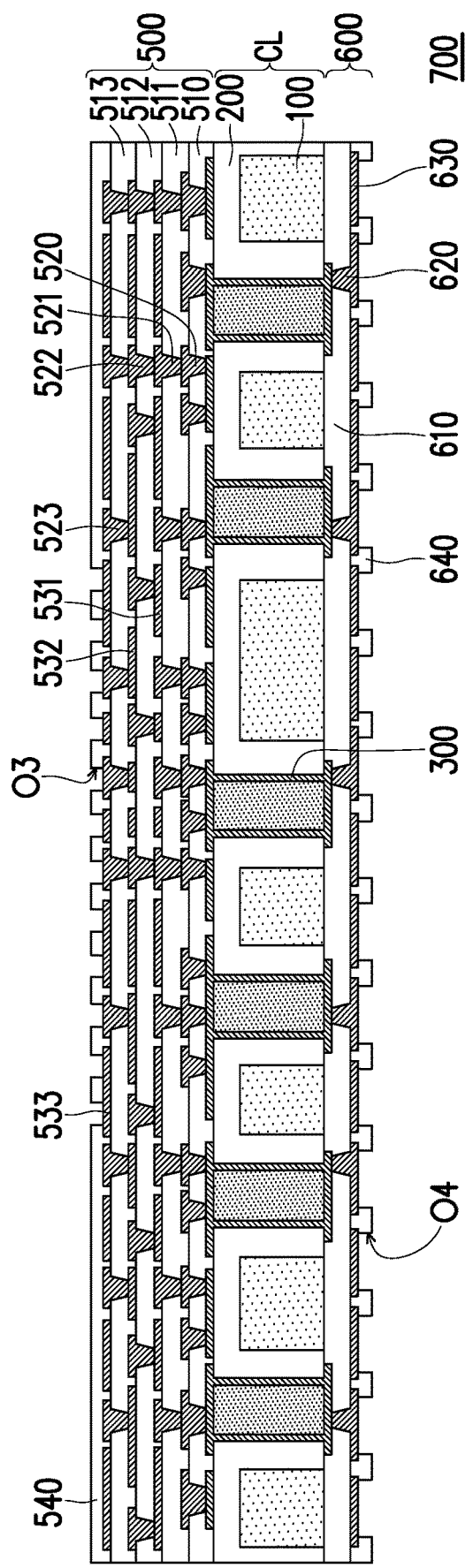

In some embodiments, referring to FIG. 1J and FIG. 1K, the topmost dielectric layer 513a may be patterned to form a topmost dielectric layer 513 exposing the underlying conductive vias 522 and portions of the conductive layer 532. A conductive layer 533 may be formed over the topmost dielectric layer 513. The conductive layer 533 may be connected to the underlying conductive layers 531, 532 and the underlying conductive vias 520, 521, 522 by conductive vias 523 wrapped by the topmost dielectric layer 513. Similarly, the lower dielectric material layer 610a (shown in FIG. 1J) may be patterned to form a lower dielectric layer 610 exposing the metallization layer 300. Conductive vias 620 may be embedded in the lower dielectric layer 610 to contact the metallization layer 300, and establish electrical connection between the metallization layer 300 and a conductive layer 630 formed over the lower dielectric layer 610. A material and a formation method of the conductive layer 533 and the conductive vias 523 may be selected from similar options to the ones described above for the conductive layers 531, 532 and the conductive vias 520, 521, 522, and a description thereof is omitted herein. Patterned mask layers 540 and 640 may be optionally formed over the outermost dielectric layers 513 and 610, respectively. For example, the patterned mask layer 540 includes openings O3 exposing at least a portion of the outermost conductive layer 533 and, optionally, of the outermost conductive vias 523. In some embodiments, the patterned mask layer 640 includes openings O4 exposing portions of the conductive layer 630 and the conductive vias 620. In some embodiments, a material of the patterned mask layers 540, 640 include polymeric materials, or other suitable insulating materials. In some embodiments, the material of the patterned mask layers 540, 640 includes silica, barium sulfate, epoxy resin, a combination thereof, or the like. The materials of the patterned mask layers 540, 640 serving as solder masks may be selected to withstand the temperatures of molten conductive materials (e.g., solders, metals, and/or metal alloys) to be subsequently disposed within the openings O3, O4. In some embodiments, the patterned mask layer 540 includes different materials than the patterned mask layer 640. In some alternative embodiments, the patterned mask layers 540, 640 include the same material. The patterned mask layers 540, 640 may be formed by lamination, printing (e.g., screen printing), spin-coating or the like. Curing steps, patterning steps, or both may be required according to the materials and method chosen for the fabrication of the patterned mask layers 540, 640. In some embodiments, the lower dielectric layer 610, the conductive vias 620 and the conductive layer 630 may be considered a lower build-up stack 600. In some embodiments, the lower build-up stack 600 may also include the patterned mask layer 640. The formation of the outermost conductive layers 533, 630 or, if included, of the patterned mask layers 540, 640 may complete a circuit board 700 according to some embodiments of the disclosure.

In some embodiments, the circuit board 700 includes a core layer CL sandwiched between a build-up stack 500 and the lower dielectric layer 610. In some embodiments, the build-up stack 500 includes the stacked upper dielectric layers 510, 511, 512, 513, the conductive layers 531, 532, 533 sandwiched between pairs of adjacent dielectric layers 511, 512, 513, and the conductive vias 520, 521, 522, 523 electrically connecting the conductive layers 531, 532, 533 among themselves and with the metallization layer 300 of the core layer CL In some embodiments, the upper build-up stack 500 further includes the patterned mask layer 540 disposed over the topmost dielectric layer 513. In some embodiments, the lower dielectric layer 610 may act as a passivation layer for the metallization layer 300 exposed by the core layer CL, with the patterned mask layer 640 (if included) acting as a solder mask. The conductive layer 630 and the conductive vias 620 provide electrical connection to the metallization layer 300.

Figure 1L:
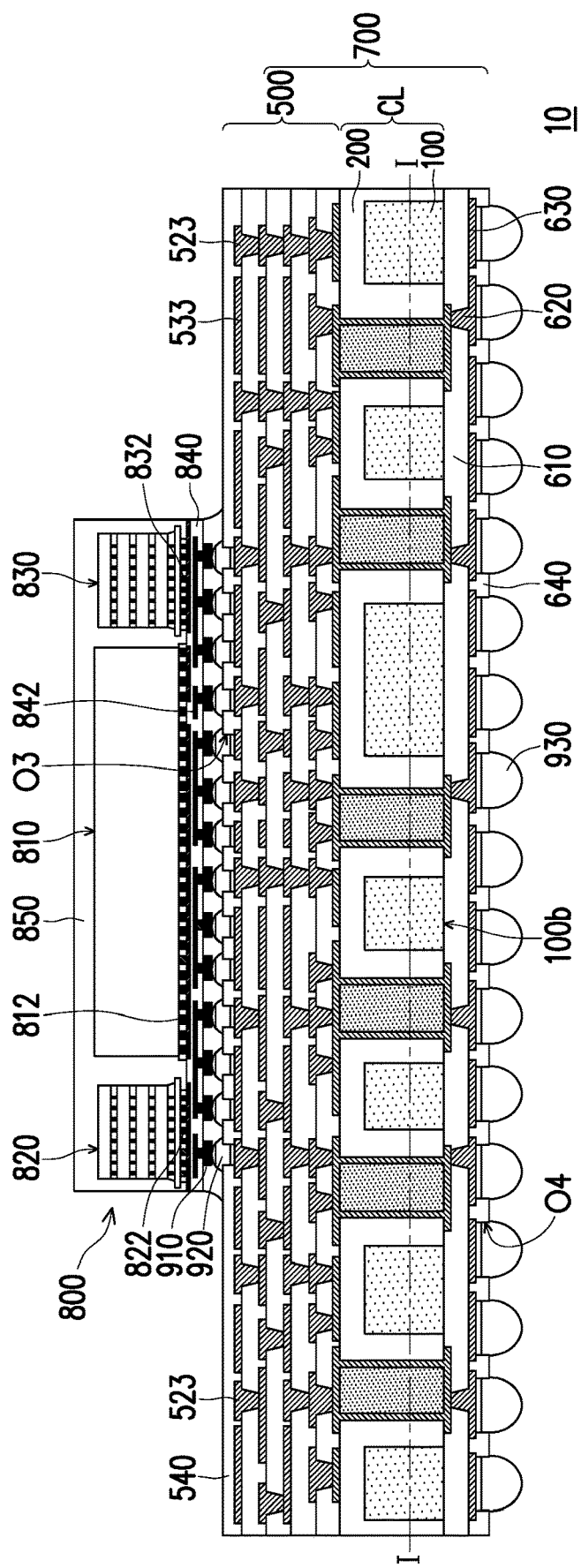

Referring to FIG. 1L, in some embodiments at least one semiconductor package 800 is connected to the printed circuit board 700 to form a semiconductor device 10. For example, the semiconductor package 800 may be connected to the upper side of the printed circuit board 700 where the upper build-up stack 500 is formed. The disclosure is not limited neither by the type nor the number of semiconductor packages 800 connected to the printed circuit board 700. In the drawings of the present disclosure, a Chip-on-Wafer (CoW) package is shown as the semiconductor package 800 for purpose of illustration. However, it will be apparent that other types of semiconductor packages may be used to produce semiconductor devices including the printed circuit boards disclosed herein, and all these semiconductor devices are intended to fall within the scope of the present description and of the attached claims. For example, System-On-Chip, (SoC) Integrated-Fan-Out (InFO) packages, Chip-On-Wafer-On-Substrate (CoWoS), three-dimensional integrated circuit (3DIC), Package-on-Package (PoP) systems etc. may all be used as the semiconductor packages 800, alone or in combination.

The non-limiting, exemplary package 800 shown in FIG. 1K may include semiconductor dies 810, 820, 830, bonded to an interposer 840 and encapsulated by an encapsulant 850. In some embodiments, the semiconductor dies 810, 820, 830 include semiconductor substrates having active components (e.g., transistors or the like) and optionally passive components (e.g., resistors, capacitors, inductors, or the like) formed therein. The semiconductor dies 810, 820, 830 may be connected to the interposer 840 via connectors 812, 822, 832. In some embodiments, the connectors 812, 822, 832 include copper, copper alloys, or other conductive materials, and may be formed by deposition, plating, or other suitable techniques. In some embodiments, the connectors 812, 822, 832 are prefabricated structures attached over the contact pads of the semiconductor dies 810, 820, 830. In some embodiments, the connectors 812, 814, 816 include solder balls, ball grid array (BGA) connectors, metal pillars, controlled collapse chip connection (C4) bumps, micro bumps, bumps formed via electroless nickel-electroless palladium-immersion gold technique (ENEPIG), a combination thereof (e.g., a metal pillar with a solder ball attached), or the like. In some embodiments, an underfill may be formed to protect the connectors 812, 814, 816 from mechanical stresses. Each of the semiconductor dies 810, 820, 830 may independently be or include a logic die, such as a central processing unit (CPU) die, a graphic processing unit (GPU) die, a micro control unit (MCU) die, an input-output (I/O) die, a baseband (BB) die, or an application processor (AP) die. In some embodiments, one or more of the semiconductor dies 810, 820, 830 include a memory die such as a high bandwidth memory die. In some embodiments, the semiconductor dies 810, 820, 830 may be the same type of dies or perform the same functions. In some embodiments, the semiconductor dies 810, 820, 830 may be different types of dies or perform different functions. In some embodiments, the semiconductor die 810 includes a logic die, and the semiconductor dies 820 and 830 include memory dies. In some embodiments, the semiconductor dies 820 and 830 include memory stacks, in which multiple electrically connected chips are stacked on top of each other. Generally speaking, the semiconductor package 800 may include a wide variety of devices, such as processors, resistors, capacitors, transistors, diodes, fuse devices, memories, discrete electronic devices, power coupling devices or power systems, thermal dissipation devices, combinations thereof, or the like formed therein. The interposer 840 may include conductive vias 842 formed therein to provide vertical electrical connection, allowing the semiconductor dies 810, 820, 830 to be connected to external devices via the circuit board 700. Some of the conductive vias 842 may electrically connect the semiconductor dies 810, 820, 830.

In some embodiments, the semiconductor package 800 may be connected to the circuit board 700 via connectors 910, 920. In some embodiments, connectors 910, 920 may be selected from similar options as previously described for the connectors 812, 814, 816. In some embodiments, the connectors 910, 920 include metals such as copper, nickel, or the like. In some embodiments, the connectors 910 are formed on the semiconductor package 800 and the connectors 920 are formed on the circuit board 700 (for example, in the openings O3 of the upper build-up stack 500). The connectors 910 on the semiconductor package 800 may be jointed to the connectors 920 to provide electrical connection between the semiconductor package 800 and the circuit board 700. For example, solder paste (not shown) may be applied on either or both of the connectors 910, 920 before placing the semiconductor package 800 over the circuit board 700, and the connectors 910, 920 may be soldered together during a reflow process. In some embodiments, under-bump metallurgies (not shown) may be formed between the connectors 910 and the interposer 840 and between the connectors 920 and the portions of the conductive layer 533 exposed by the openings O3. According to some embodiments, connectors 930 may be formed in the openings O4 of the patterned mask layer 640 to allow integration of the semiconductor device 10 within larger systems (not shown).

In some embodiments, as shown in FIG. 1L, a build-up stack 500 is built only on one side of the circuit board 700. In some embodiments, inclusion of only the upper build-up stack 500 on the circuit board 700 (i.e., without a corresponding build-up stack on an opposite side) would lead to serious warpage issues were the patterned conductive plate 100 not included in the core layer CL of the circuit board 700. That is, because the patterned conductive plate 100 is included in the circuit board 700, the overall mechanical stability may be increased, rendering possible to have a build-up stack 500 on one side only of the circuit board 700, with external connectors 930 disposed on an opposite side of the circuit board 700 over a single dielectric layer 610 and an optional patterned mask layer 640. In some embodiments, the patterned conductive plate 100 is embedded in a single core dielectric layer 200. The bottom surface 100b of the patterned conductive plate 100 may be exposed by the core dielectric layer 200 and may be in direct contact with the lower dielectric layer 610. In some embodiments, when the patterned conductive plate 100 is embedded in a single core dielectric layer 200, the manufacturing process may be simplified in terms of number of steps and materials required, thus lowering the unitary manufacturing cost. In some embodiments, the patterned conductive plate 100 may help to dissipate the heat generated during the usage of the semiconductor device 10, thus increasing the reliability of the semiconductor device 10.

Figure 2:
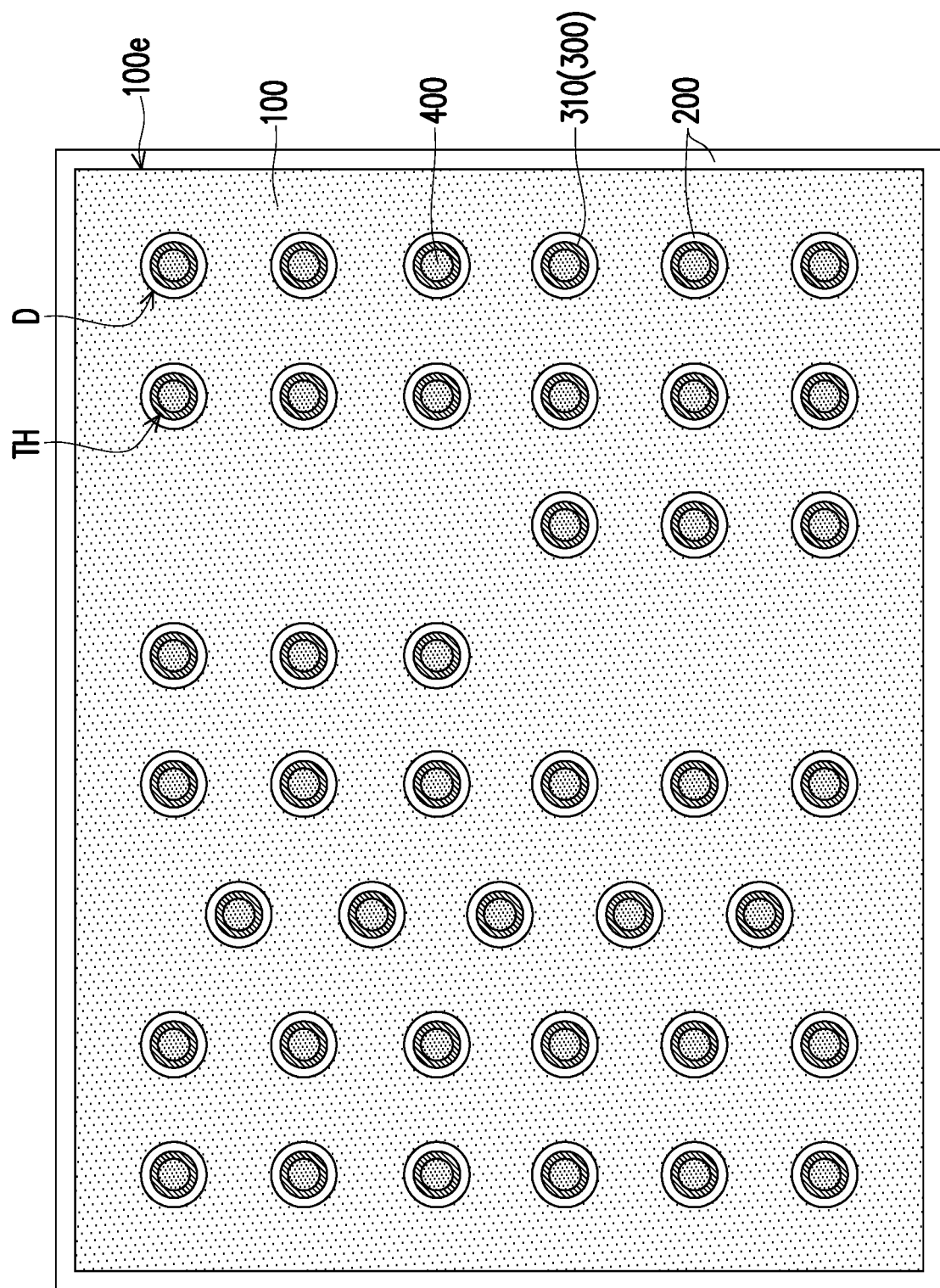
FIG. 2 is a schematic cross-sectional view of a circuit board according to some embodiments of the present disclosure.

FIG. 2 shows a schematic cross-sectional view of the circuit board 700 according to some embodiments of the disclosure. The cross-sectional view of FIG. 2 is taken in a plane normal to the plane of view illustrated in FIG. 1L, lying at the level I-I shown in FIG. 1L. In some embodiments, as shown in FIG. 2, the distribution of the ducts D varies throughout the patterned conductive plate 100, and may be optimized to reduce warpage issues while taking into account the final distribution of the semiconductor devices 800 (shown in FIG. 1L) over the circuit board 700. In some embodiments, the ducts D are filled by portions of the core dielectric layer 200 defining the through holes TH, where the via portion 310 of the metallization layer 300 and the via filler 400 are disposed. The via portion 310 of the metallization layer 300 may be disposed in between the via filler 400 and the core dielectric layer 200. In the view of FIG. 2, the core dielectric layer 200, the metallization layer 300 and the via filler 400 may form a concentric structure disposed within the ducts D. The core dielectric layer 200 may further extend along the outer edge 100e of the patterned conductive plate 100.

Figure 3:
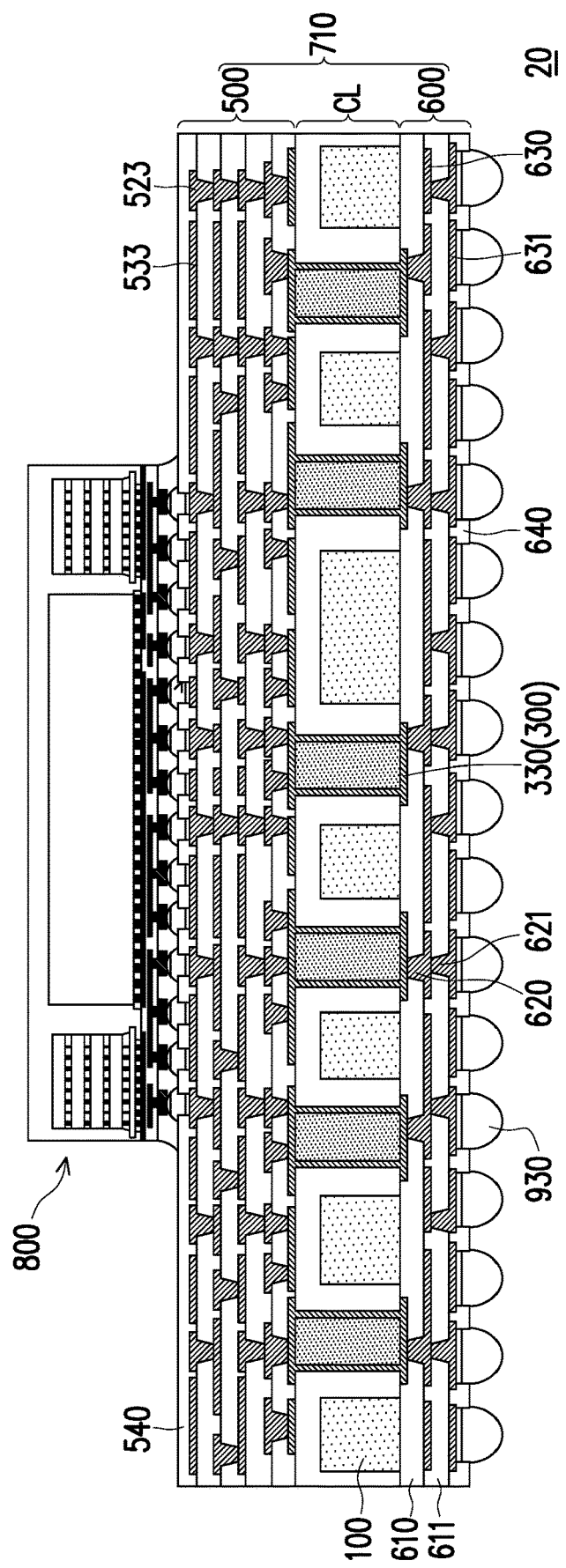
FIG. 3 is a schematic cross-sectional view of a semiconductor device according to some embodiments of the present disclosure.

In FIG. 3 is shown a cross-sectional view of a semiconductor device 20 according to some embodiments of the disclosure. The semiconductor device 20 may include the circuit board 710 and the semiconductor package 800. The semiconductor device 20 of FIG. 3 may be similar to the semiconductor device 10 of FIG. 1L, and the following description will focus on some of the differences between the two semiconductor devices 10 and 20. The circuit board 710 included in the semiconductor device 20 includes the upper build-up stack 500 disposed between the core layer CL and the semiconductor package 800, and a lower build-up stack 600 disposed between the core layer CL and the connectors 930. The lower build-up stack 600 includes the lower dielectric layer 610, the conductive vias 620 and conductive layer 630 electrically connected to the metallization layer 300 and the patterned mask layer 640. Furthermore the build-up stack 600 includes a second dielectric layer 611 and a second conductive layer 631 disposed between the lower dielectric layer 610 and the patterned mask layer 640. The second conductive layer 631 may be disposed between the second dielectric layer 611 and the patterned mask layer 640, and may be electrically connected to the conductive layer 630 by the conductive vias 621. As in the semiconductor device 10 of FIG. 1L, in the semiconductor device 20 of FIG. 3, the patterned conductive plate 100 physically contacts the lower dielectric layer 610, but the metallization layer 300 does not electrically contact the patterned conductive plate 100. In some embodiments, the lower build-up stack 600 includes less dielectric layers 610, 611, and conductive layers 630, 631 than the upper build-up stack 500. However, it should be noted that the number of the conductive layers 630, 631, the number of conductive vias 620, 621, and the number of the dielectric layers 610, 611 illustrated in FIG. 3 are merely for illustrative purposes, and the disclosure is not limited thereto. In some alternative embodiments, more conductive layers, dielectric layers and conductive vias are formed depending on the circuit design. In these embodiments, the conductive layers are sandwiched between adjacent dielectric layers and are interconnected with one another by the conductive vias.

In light of the foregoing, the patterned conductive plate included in the core layer of the circuit boards of the present disclosure may enhance the structural rigidity of the circuit board, thus reducing the possibility of failure because of warpage during subsequent manufacturing processes. In some embodiments, the patterned conductive plate allows a heavily asymmetric distribution of dielectric layers between build-up stacks on opposite sides of the circuit board. In some embodiments, because fewer layers are included in the build-up stacks, the manufacturing costs are reduced and the yields are increased. In some embodiments, the patterned conductive plate may also enhance the thermal dissipation of the circuit board, and provide improved electrical inductance and resistance properties of the core layer. In some embodiments, as the through hole vias establishing double-sided communication between opposite sides of the circuit board may be filled with rigid material (e.g., metal), a further increase in structural stability may also be achieved.

In accordance with some embodiments of the disclosure, a structure is provided. The structure includes a core dielectric layer, a patterned conductive plate, a metallization layer, an upper build-up stack and a lower dielectric layer. The patterned conductive plate has ducts there-through and is entrenched in the core dielectric layer. The metallization layer is disposed within the ducts and further extends over an upper surface and a bottom surface of the core dielectric layer. The upper build-up stack is disposed on the upper surface of the core dielectric layer. The upper build-up stack includes conductive layers electrically connected to the metallization layer. The lower dielectric layer is disposed on the bottom surface of the core dielectric layer and is in direct physical contact with a bottom surface of the patterned conductive plate. A material of the lower dielectric layer is different from a material of the core dielectric layer.

In accordance with some embodiments of the disclosure, a semiconductor device is provided. The semiconductor device includes a circuit board and a semiconductor package. The circuit board includes a patterned conductive plate, a core dielectric layer, plated through hole vias, a metallization pattern, an upper build-up stack, and a lower build-up stack. The patterned conductive plate is crossed by ducts opening on opposite surfaces of the patterned conductive plate. The core dielectric layer wraps the patterned conductive plate and exposes a bottom surface of the patterned conductive plate. The plated through vias are formed within the ducts of the patterned conductive plate and penetrates through the core dielectric layer. The metallization layer is disposed over the core dielectric layer. The plated through vias and the metallization layer are electrically insulated from the patterned conductive plate. The upper build-up stack is disposed on an upper surface of the core dielectric layer and has dielectric layers and interconnected conductive layers stacked alternately. The lower build-up stack is disposed on a bottom surface of the core dielectric layer and has at least one dielectric layer. The semiconductor package is disposed on the upper build-up stack and is electrically connected with the plated through vias through the upper build-up stack.

In accordance with some embodiments of the disclosure, a manufacturing method of a circuit board is provided. The method includes at least the following steps. A conductive plate is provided. The conductive plate is patterned to form ducts. The patterned conductive plate is laminated with a core dielectric layer. The lamination leaves exposed a bottom surface of the patterned conductive plate. Through holes are opened in portions of the core dielectric layer filling the ducts. A conductive material is formed in the through holes and over the core dielectric layer to produce a metallization layer. Dielectric layers and conductive layers are alternately stacked on an upper surface of the core dielectric layer. The conductive layers are electrically connected to the metallization layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A structure, comprising:
   a core dielectric layer;
   a patterned conductive plate having ducts there-through and entrenched in the core dielectric layer;
   a metallization layer, disposed within the ducts and further extending over an upper surface and a bottom surface of the core dielectric layer;
   an upper build-up stack disposed on the upper surface of the core dielectric layer, comprising conductive layers electrically connected to the metallization layer; and
   a lower dielectric layer disposed on the bottom surface of the core dielectric layer, and in direct physical contact with a bottom surface of the patterned conductive plate,
   wherein a material of the lower dielectric layer is different from a material of the core dielectric layer and the structure further comprises:
   a patterned mask layer, wherein the lower dielectric layer is disposed between the patterned mask layer and the patterned conductive plate;
   a conductive layer disposed between the lower dielectric layer and the patterned mask layer; and
   connectors electrically connected to the conductive layer, wherein the patterned mask layer includes openings, and the connectors are disposed within the openings of the patterned mask layer.

2. The structure of claim 1, wherein the lower dielectric layer is in direct physical contact with the patterned mask layer.

3. The structure of claim 1, wherein portions of the core dielectric layer line the ducts of the patterned conductive plate and are disposed between via portions of the metallization layer and the patterned conductive plate.

4. The structure of claim 1, further comprising a semiconductor package, disposed on the upper build-up stack and electrically connected to the metallization layer.

5. A semiconductor device, comprising:
   a circuit board, including:
      a patterned conductive plate, crossed by ducts opening on opposite surfaces of the patterned conductive plate;
      a core dielectric layer, wrapping the patterned conductive plate and exposing a bottom surface of the patterned conductive plate;
      plated through vias formed within the ducts of the patterned conductive plate and penetrating through the core dielectric layer;
      a metallization pattern, disposed over the core dielectric layer, wherein the plated through vias and the metallization pattern are electrically insulated from the patterned conductive plate;
      an upper build-up stack, disposed on an upper surface of the core dielectric layer and having dielectric layers and interconnected conductive layers stacked alternately; and
      a lower build-up stack, disposed on a bottom surface of the core dielectric layer and having at least one dielectric layer; and
   a semiconductor package disposed on the upper build-up stack and electrically connected with the plated through vias through the upper build-up stack.

6. The semiconductor device of claim 5, wherein the lower build-up stack includes one single dielectric layer and one conductive layer.

7. The semiconductor device of claim 5, wherein the plated through vias include via fillers.

8. The semiconductor device of claim 5, wherein the metallization pattern extends over the patterned conductive plate.

9. The semiconductor device of claim 5, wherein a material of the at least one dielectric layer is different from that of the core dielectric layer.

10. The semiconductor device of claim 5, wherein the core layer includes a single core dielectric layer.

* * * * *